(12) United States Patent
Mochizuki et al.

(10) Patent No.: US 8,079,375 B2
(45) Date of Patent: Dec. 20, 2011

(54) PROCESSING APPARATUS AND ATMOSPHERE EXCHANGE METHOD

(75) Inventors: Shinya Mochizuki, Utsunomiya (JP); Takashi Kamono, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 525 days.

(21) Appl. No.: 12/057,468

(22) Filed: Mar. 28, 2008

(65) Prior Publication Data

US 2008/0247845 A1    Oct. 9, 2008

(30) Foreign Application Priority Data

Apr. 6, 2007   (JP) ................. 2007-100322

(51) Int. Cl.
*B08B 11/00*   (2006.01)
(52) U.S. Cl. ...................................................... 134/105
(58) Field of Classification Search .............. 134/1, 105; 216/66; 219/635; 156/345; 355/75; 414/217, 414/221
See application file for complete search history.

(56) References Cited

U.S. PATENT DOCUMENTS

| | | | |
|---|---|---|---|
| 6,177,661 | B1 | 1/2001 | Lee et al. |
| 6,805,751 | B2 * | 10/2004 | Allen ................................. 134/1 |
| 2006/0066834 | A1 * | 3/2006 | Phillips et al. .................. 355/75 |
| 2006/0291982 | A1 * | 12/2006 | Tanaka ..................... 414/222.01 |

FOREIGN PATENT DOCUMENTS

| | | | |
|---|---|---|---|
| JP | 2886521 | A | 6/1998 |
| JP | 11-345771 | * | 12/1999 |
| JP | 11-345771 | A | 12/1999 |
| JP | 2003-168712 | A | 6/2003 |

OTHER PUBLICATIONS

Okuyama et al., "New System Chemical Engineering, Fine Particles Engineering," pp. 106-107, May 1992 Ohmusha Publishing (with English translation).

* cited by examiner

*Primary Examiner* — Michael Kornakov
*Assistant Examiner* — Douglas Lee

(57) ABSTRACT

A processing apparatus configured to process a substrate under a vacuum environment includes a holding unit configured to hold the substrate, a dust collection part having a surface opposite to the substrate held by the holding unit, a vacuum chamber configured to accommodate the holding unit and to have an internal space that can be decompressed, a temperature controlling unit configured to control a temperature of the surface of the dust collection part opposite to the substrate to a temperature lower than a temperature of the substrate, and a driving unit configured to bring one of the holding unit and the dust collection part close to the other after the temperature controlling unit controls the temperature of the surface of the dust collection part opposite to the substrate.

5 Claims, 6 Drawing Sheets

PROCESSING APPARATUS AND ATMOSPHERE EXCHANGE METHOD

BACKGROUND OF THE INVENTION

The present invention relates to an atmosphere exchange method.

A conventional load lock chamber imports a substrate from a substrate stocker that is placed in the atmosphere environment, into a processing chamber that processes the substrate in the vacuum atmosphere, or exports a processed substrate from the processing chamber to the substrate stocker. The processing chamber, as used herein, covers a EUV (extreme ultraviolet) exposure apparatus and a plasma processing apparatus.

The load lock chamber serves to exchange an atmosphere in the internal space between the atmosphere environment and the vacuum environment. More specifically, the load lock chamber exchanges the atmosphere from the atmosphere environment to the vacuum environment in importing the substrate into the processing chamber (in the exhaust process), and exchanges the atmosphere from the vacuum environment to the atmosphere environment in exporting the substrate to the substrate stocker (in the air-supply process). The load lock chamber is connected to the processing chamber via a gate valve, and includes a substrate transport mechanism.

However, particles swirl from the gate valve and the substrate transport mechanism in the air-supply and exhaust time. Therefore, a means is necessary to reduce or prevent their adhesions to the substrate. Accordingly, one proposed method reduces particles' adhesions to the substrate utilizing the thermophoretic force. As disclosed in Japanese Patent No. 2,886,521, this method heats the holder of the substrate up to a temperature higher than the peripheral temperature, and collects particles from a low-temperature particle collector maintained at a temperature lower than the peripheral temperature.

According to the principle of the thermophoretic force, with a temperature gradient in the gas around the particles, the particles are given the kinetic energy from the gas molecules at the high temperature side higher than that of the gas molecules at the low temperature side, and moves from the object at the high temperature side to the low temperature side. Thermophoretic force Fx is given by the following equation by the thermophoresis coefficient equation described in Kikuo Okuyama, Hiroaki Masuda, and Seiji Morooka, "New System Chemical Engineering, Fine Particles Engineering," pp. 106-107, May of 1992, Ohmsha Publishing.

$$Fx = \frac{-6\pi D_p \mu^2 C_s (K + C_t K_n)}{\rho(1 + 3C_m K_n)(1 + 2K + 2C_t K_n)} \cdot \frac{1}{T} \cdot \frac{\Delta T}{\Delta x} \quad \text{EQUATION 1}$$

Equation 1 assumes that the particle is spherical and the fluid is the ideal gas. Dp is a particle diameter. T is a gas temperature. $\mu$ is a viscosity density. $\rho$ is a gas density. Kn is a Knudsen number and $2\lambda/Dp$. $\lambda$ is a mean free path and $\eta/\{0.499 P(8M/\pi RT)^{1/2}\}$. M is a molecular weight. R is a gas constant. K is k/kP. k is a thermal conductivity of the gas only caused by the parallel movement energy. kp is the thermal conductivity of the particle. Cs is 1.17. Ct is 2.18. Cm is 1.14. $\Delta T/\Delta x$ is a temperature gradient.

The dimension of the load lock chamber is restricted by the gate opening size (W360 mm×H80 mm) determined by the uniform standard in the semiconductor field, and cannot be made as small as the substrate's external shape. Therefore, the thermophoretic force near the substrate holder inevitably depends upon a shape of the load lock chamber, and cannot be maximized.

SUMMARY OF THE INVENTION

The present invention is directed to an atmosphere exchange method that reduces adhesions of particles to the substrate in a vacuum chamber. The "vacuum chamber," as used herein, means an apparatus that needs a reduced pressure state in principle like an exposure chamber in a EUV exposure apparatus, and an apparatus that temporarily holds the reduced pressure state like a load lock chamber of a substrate transport mechanism.

A processing apparatus according to one aspect of the present invention configured to process a substrate under a vacuum environment includes a holding unit configured to hold the substrate, a dust collection part having a surface opposite to the substrate held by the holding unit, a vacuum chamber configured to accommodate the holding unit and to have an internal space that can be decompressed, a temperature controlling unit configured to control a temperature of the surface of the dust collection part opposite to the substrate to a temperature lower than a temperature of the substrate, and a driving unit configured to bring one of the holding unit and the dust collection part close to the other after the temperature controlling unit controls the temperature of the surface of the dust collection part opposite to the substrate.

An atmosphere exchange method according to another aspect of the present invention is a method for exchanging an atmosphere in an internal space of a load lock chamber between a vacuum environment and an atmosphere environment. The load lock chamber is connected via a gate valve to a processing chamber configured to process a substrate under the vacuum environment. The method includes the steps of controlling a temperature of a surface of a dust collection part opposite to the substrate to a temperature lower than that of the substrate, bringing one of the substrate and the surface of the dust collection part close to the other after the controlling step, and exchanging the atmosphere in the internal space of the load lock chamber after the bringing step.

A further object and other characteristics of the present invention will be made clear by the preferred embodiments described below referring to accompanying drawings.

DESCRIPTION OF THE EMBODIMENTS

Referring now to the accompanying drawings, a description will be given of a processing apparatus according to the embodiment of the present invention.

First Embodiment

Figure 1:
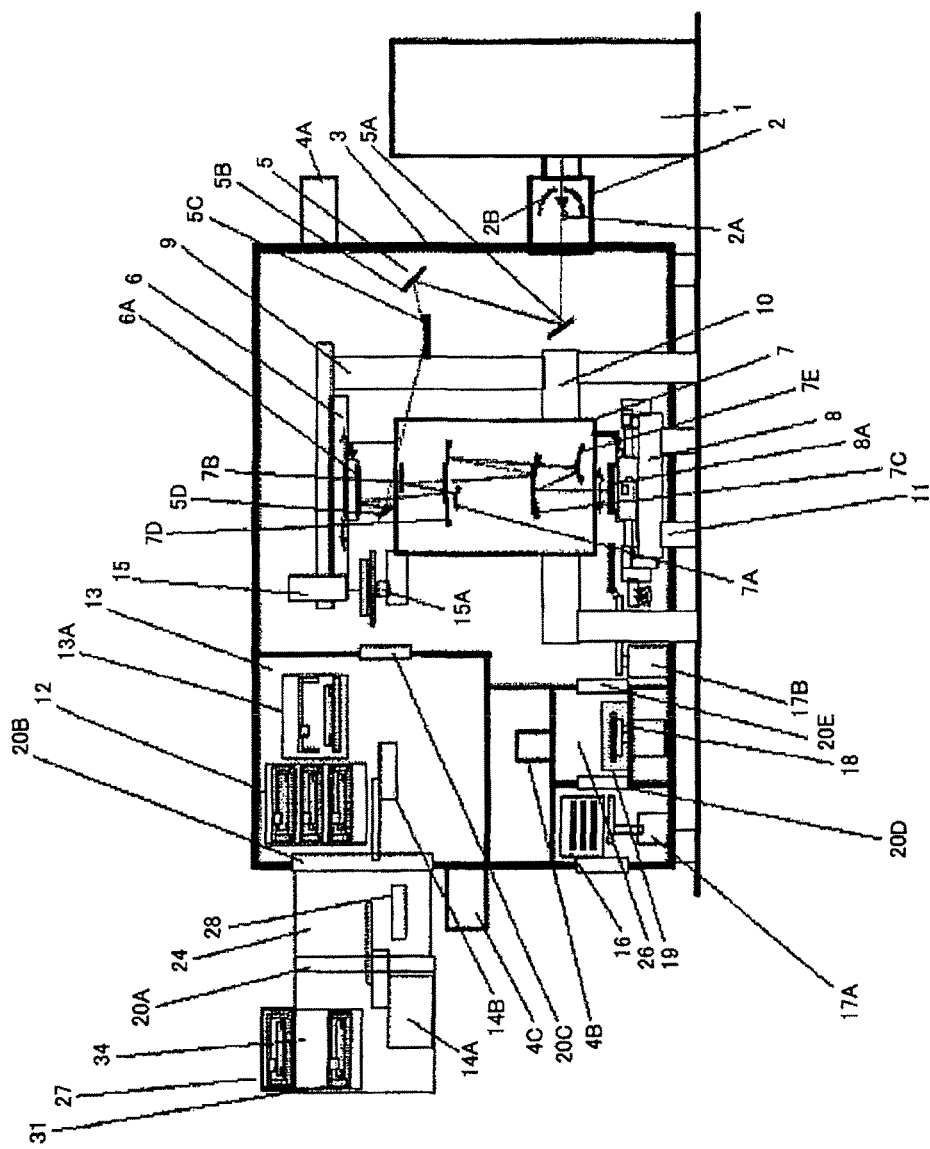
FIG. 1 is a schematic sectional view of an exposure apparatus according to a first embodiment of the present invention.

FIG. 1 is a schematic sectional view of an exposure apparatus according to a first embodiment. In FIG. 1, 1 denotes an excitation laser, which uses a YAG solid laser, etc. The excitation laser 1 irradiates the laser beam to an emission point of a light source, and emits the light for plasma excitation of the light source material atoms. The point is made by gasifying, liquefying, or spraying a light source material. 2 denotes a light source emission part in the exposure light source which maintains vacuum in its inside. 2A denotes an emission point of the exposure light source. 2B denotes a light source mirror arranged as a semispherical mirror around the emission point 2A so as to condense and reflect the overall spherical light from the emission point 2A towards the emission direction. A nozzle (not shown) is used to emit liquefied Xe, liquefied Xe spray, or Xe gas as an emission atom to the emission point 2A, and the light from the excitation laser 1 is irradiated to the emission point 2A.

3 denotes an exposure chamber (processing chamber) connected to the light source emission part 2. The exposure chamber 3 is maintained at a vacuum environment or a reduced pressure by an exhausting unit (vacuum pump) 4A. Thus, the exposure chamber 3 is a vacuum chamber that can maintain the vacuum pressure suitable for the EUV exposure. 5 denotes an illumination optical system that introduces and shapes the exposure light from the light source emission part 2, includes mirrors 5A to 5D, and homogenizes and shapes the exposure light. 6 denotes a reticle stage, and a reticle (original) 6A is electrostatically held as a reflective original having an exposure pattern, on a movable part of the reticle stage 6.

7 denotes a projection optical system that projects a reduced image of an exposure pattern reflected from the reticle 6A onto a wafer 8A at a preset reduction ratio via mirrors 7A to 7E sequentially in this order to reflect an exposure pattern reflected by the reticle 6A. 8 denotes a wafer stage that positions to an exposure position a wafer 8A as a Si substrate, to which the reticle pattern is exposed, so as to control the position of the wafer stage in six axes directions including XYZ axes directions, tilting directions around the X-axis and Y-axis, and a rotational direction around the Z-axis.

9 denotes a support member that supports the reticle stage 6 on the floor. 10 denotes a support member that supports the projection optical system 7 on the floor. 11 denotes a support member that supports the wafer stage 8 on the floor. A control unit (not shown) measures and continuously maintains a relative position between the reticle stage 6 and the projection optical system 7 and a relative position between the projection optical system 7 and the wafer stage 8. The support members 9 to 11 each has a mount (not shown) that isolates the vibration from the floor.

16 denotes a wafer stocker that temporarily stores a wafer 8A inside the apparatus, which has been carried by a wafer carrier unit 17A at the atmospheric air side. The wafer stocker 16 stores plural wafers. The wafer 8A to be exposed is sorted from the wafer stocker 16, and transported to the holding unit 18 in the load lock chamber 26. 19 denotes a shield that encloses the periphery of the wafer. 20D is a gate valve that connects the space of the wafer stocker 16 to the load lock chamber 26, and opens and closes when the load lock chamber 26 is in the atmospheric pressure state. 20E is also a gate valve that connects the load lock chamber 26 to the exposure chamber 3, and opens and closes when the load lock chamber 26 in the vacuum state. The wafer carrier unit 17B that can transport a wafer in the vacuum state carries the wafer from the holding unit 18 to a wafer mechanical pre-alignment temperature controller (not shown) that is placed in the exposure chamber (processing chamber). The wafer mechanical pre-alignment temperature controller provides rough adjustments in the wafer's rotating direction as well as controlling the wafer temperature to the reference temperature of the exposure apparatus. The wafer carrier unit 17B feeds to the wafer stage 8 the wafer 8A aligned and temperature-controlled by the wafer mechanical pre-alignment temperature controller.

An export procedure of the wafer 8A from the exposure chamber 3 is opposite to the loading procedure.

27 denotes an SMIF pod as a miniature environment used to transport a reticle cassette in the device factory. 31 denotes a reticle cassette held in the SMIF pod. As soon as an SMIF indexer 34 opens and closes the SMIF pod, the reticle cassette 31 is introduced into the exposure apparatus so that the reticle cassette 31 can be transported by the reticle carrier unit 14A. 24 denotes a load lock chamber used to exchange an atmosphere for the reticle cassette 31 from the air atmosphere to the vacuum atmosphere, and includes a cassette holder 28.

20A denotes a gate valve that connects the space of the reticle cassette 31 to the load lock chamber 24, and opens and closes when the load lock chamber 24 is in the atmosphere pressure state. It is a gate opening/closing mechanism that imports the reticle 6A into the holder of the load lock chamber 24 from the SMIF indexer 34. 20B is also a gate valve that opens and closes when the load lock chamber 24 is in the vacuum state. 20C is also a gate valve that opens and closes in importing the reticle 6A into the exposure chamber 3.

12 denotes a reticle stocker that temporarily stores the reticle 6A from the outside of the apparatus to the inside of the apparatus while the reticle 6A is housed in the reticle cassette 31. The reticle stocker 12 stores the reticles 6A having different patterns and different exposure conditions at multiple stages.

14A denotes a reticle carrier unit that carries the reticle cassette 31 to the reticle stocker 21 from the load lock chamber 24. The reticle carrier unit 14B is arranged in a reticle carrier chamber 13, selects a target reticle from the reticle stocker 12, and transports the reticle cassette 31 to a lid opening mechanism 13A that divides it into a cassette's upper lid and a cassette's lower plate. A reticle carrier unit 14B transports the cassette's lower plate that has been separated by the lid opening mechanism 13A, to a reticle alignment scope 15 that is provided at the end of the reticle stage 6. Thereby, it minutely moves for alignments in the XYZ-axes rotational direction on the reticle 6A relative to the alignment mark 15A on the housing of the projection optical system 7.

The aligned reticle 6A is chucked on the reticle stage 6 directly from the cassette's lower plate. At least one of ascending of the cassette support member or descending of the reticle stage is performed so as to reduce a distance between a cassette support member of an alignment part and the reticle stage 6. At the same time, a tilt is adjusted between the reticle 6A and the reticle stage 6. A vacant cassette's lower plate is returned to the lid opening mechanism 13A by the reticle carrier unit 14B after the reticle 6A is handed to the reticle stage 6, and it is stored in the reticle stocker 12 after the lid is closed.

Figure 3A:
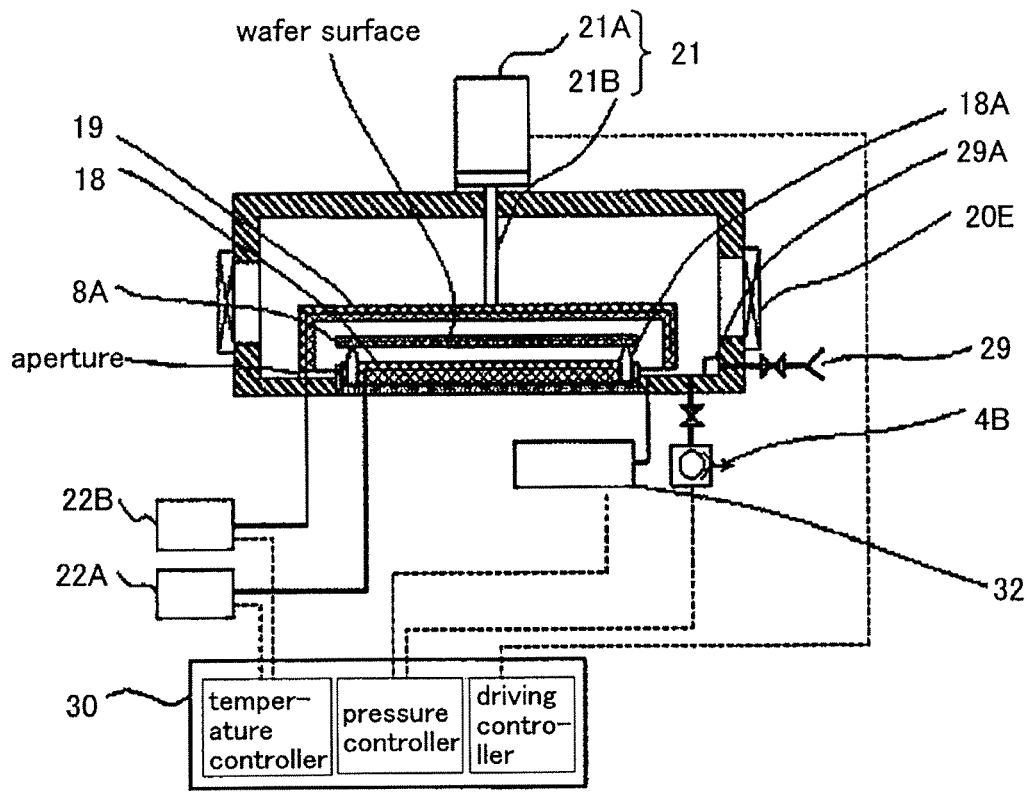
FIG. 3 is a schematic sectional view of the load lock chamber shown in FIG. 1.

FIG. 3A is a schematic sectional view of the load lock chamber 26, which moves the shield 19 as a dust collection unit through a driving unit 21 in the lower direction, and the shield 19 encloses the front surface of the wafer 8A. The driving unit 21 serves to bring one of the holding unit 18 and the shield 19 close to the other after temperature controlling units 22A and 22B control the temperature of the surface of the shield 19 opposite to the wafer 8A. A space having a distance of 0.5 cm or smaller is intentionally provided as an aperture that provides the exhaust and the air supply between the shield 19 and the wafer 8A so that the shield 19 does not contact the internal wall of the load lock chamber 26 when the shield 19 encloses the wafer 8A. Therefore, the exhaust or air supply inside the shield 19 can be simultaneously performed with that for the entire load lock chamber 26.

By moving the shield 19, a narrow space having a distance of 0.5 cm or smaller can be made between the wafer surface and the shield 19. Thus, the temperature gradient of the space near the wafer surface can be made larger than that of the conventional vacuum chamber.

The load lock chamber 26 is partitioned from the exposure chamber 3 by the gate valve 20E, and a pressure detection unit 32 detects that the inside of the load lock chamber becomes vacuum. The gate valve 20E opens and the wafer 8A is imported into or exported from the exposure chamber 3. The exhausting unit 4B exhausts or decompresses the internal space of the load lock chamber 26, and the air supply unit 29 supplies the air to or compresses the internal space. Thus, the load lock chamber 26 exchanges the atmosphere of the internal space between the vacuum environment and the atmospheric environment.

Whenever the pretreatment or post-treatment wafer 8A is imported into and exported from the load lock chamber 26, the air supply and the exhaust are repeated. Thus, particles, such as fine fluorine particles generated from the gate valve in the load lock chamber 26 and fine silverplate particles generated from the wafer transport mechanism, are likely to swirl in the exhaust or air supply process, and adhere to the wafer 8A. It is thus important to reduce particles that would adhere to the wafer 8A in the exhaust or air supply process of the load lock chamber 26.

The holding unit 18 that holds the wafer 8A controls the temperature of all members that includes the support pin 18A to the first temperature (23° C.) through the first temperature controlling unit 22A. This temperature is as high as that of the wafer 8A transported by the holding unit 18. This embodiment circulates the heat medium in the holding unit 18, and uniformly controls the temperature of the entire surface of the holding unit 18. For the shield 19 used to protect the wafer surface from the particles, the second temperature controlling unit 22B controls the temperature of the surface of the shield 19 opposite to the wafer surface to the second temperature (13° C.). The second temperature of the surface of the shield 19 is lower than the first temperature by 10° C. Thus, the temperature controlling units 22A and 22B can control the temperature of the surface of the shield 19 opposite to the wafer 8A to the temperature lower than that of the wafer 8A. Thereby, the shield 19 operates as a dust collection unit that has a dust collection part.

Figure 2:
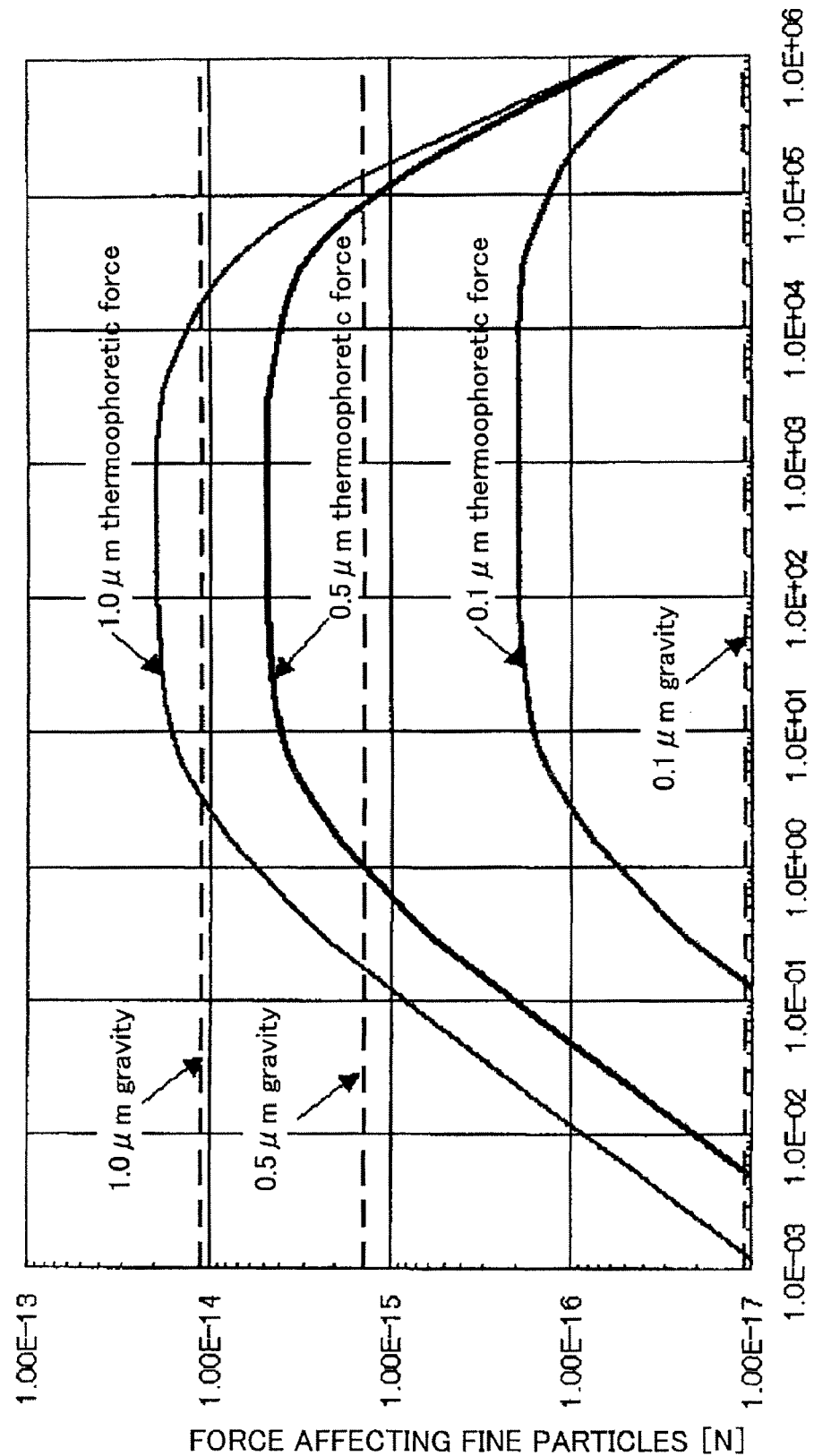
FIG. 2 is a graph that indicates the thermophoretic force that affects fine fluorine particles that float in a load lock chamber shown in FIG. 1.

FIG. 2 is a graph between the thermophoretic force and the gravity affecting fine fluorine particles when the temperature gradient is 10 [K/cm], where the ordinate axis denotes a force [m/s$^2$] and an abscissa axis denotes a pressure [Pa] in the load lock chamber 26. The thermophoretic force curve is calculated by weighing Equation 1, the gas temperature, and the solid temperature.

This embodiment controls the temperature and the position of the shield 19 so that the space can have a temperature gradient of 10 [K/cm]. When the load lock chamber 26 has a pressure of about 500 [Pa], a particle having a diameter of 0.5 µm and a particle having a diameter of 1.0 µm are affected by the maximum thermophoretic force. As shown in FIG. 2, when the pressure of the load lock chamber 26 is 10 Pa or higher, the thermophoretic force becomes greater than the gravity. When a force applied to the particle, such as a force from the airflow and the Coulomb force, is negligible, the fine fluorine particle having a diameter of 1.0 µm or smaller does not fall due to the gravity but moves in the thermophoretic-force affecting direction.

Figure 3B:
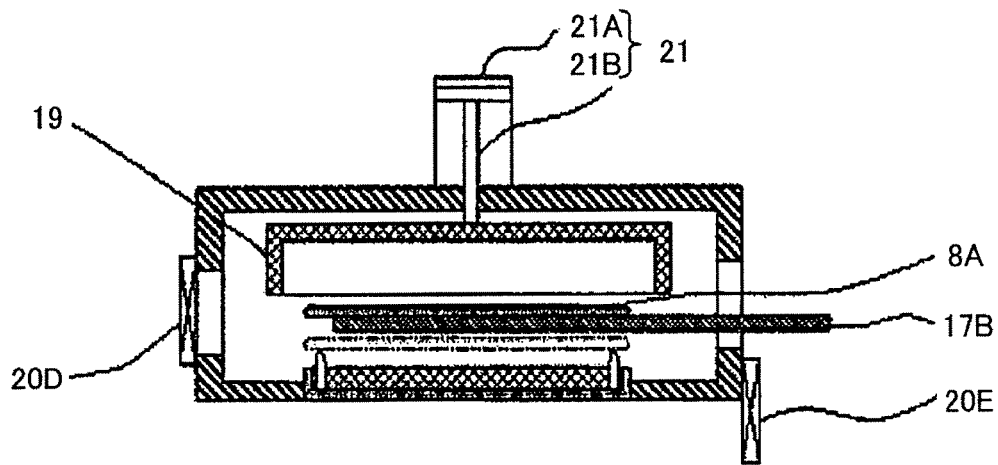

When a distance is made smaller between the wafer and the shield or when the temperature of the shield is lowered in order to increase the temperature gradient of the space, the thermophoretic force can be made greater than the gravity for a particle having a diameter of 1.0 µm or larger. Thereby, the floating particle reduces its adhesion to the wafer surface due to the thermophoretic force that affects in a direction from the wafer surface to the shield. FIG. 3B is a schematic sectional view of the load lock chamber 26 that moves the shield 19 in the driving unit 21 in the upper direction and enables the wafer 8A to be carried.

The driving unit 21 of the shield 19 may sit outside or inside the load lock chamber. This embodiment provides a driving part 21A outside the load lock chamber 26, and introduces only the power transmission part 21B into the vacuum. This embodiment isolates the power transmission part 21B from the air space through a metal bellows (not shown). The shield 19 can be driven without vibrating. 30 denotes a control unit that controls the pressure of the load lock chamber, first and second temperature controlling units, and a driving unit. The control unit 30 controls the driving unit 21 and the temperature controlling units 22A and 22B so that the space between the wafer 8A and the shield 19 can have a temperature gradient of 10 k/cm or greater.

The atmosphere exchange method of the load lock chamber 26 of this embodiment includes the temperature control step, the approaching step, and the exchange step. The temperature control step controls the temperature of the surface of the shield 19 opposite to the wafer 8A to the temperature lower than that of the wafer 8A via the temperature controlling units 22A and 22B. The approaching step brings one of the wafers 8A and the shield 19 close to the other after the temperature control step. The exchange step exchanges the atmosphere of the internal space of the load lock chamber 26 connected to the exposure chamber 3 via the gate valve 20E after the approaching step. Thereby, the particle adhesion to the wafer surface can be reduced.

Second Embodiment

Figure 4A:
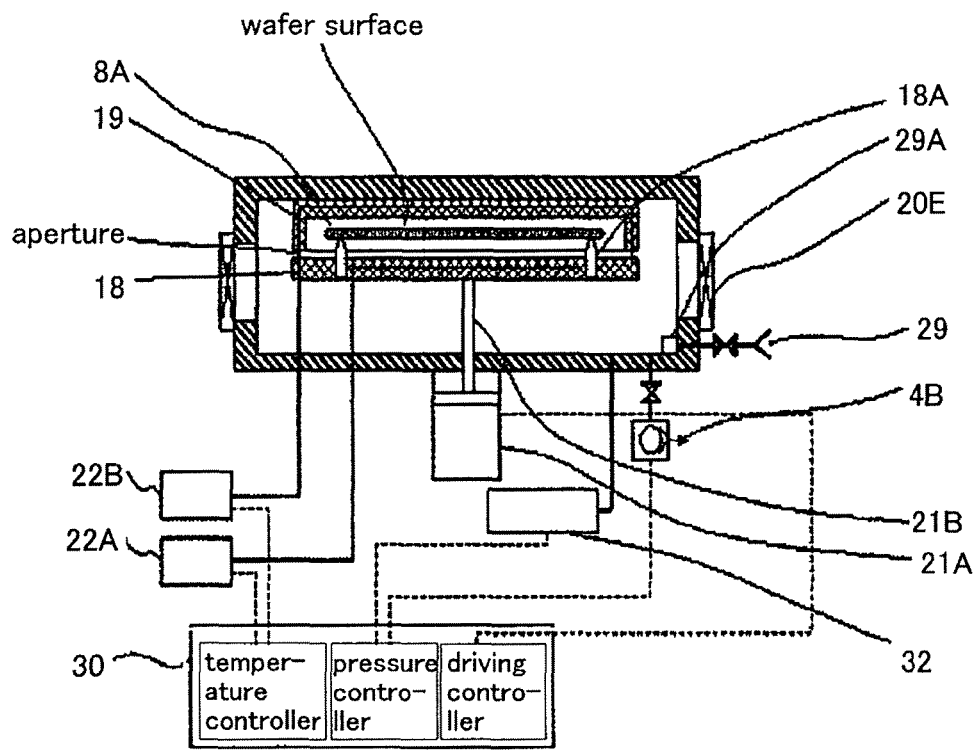
FIG. 4 is a schematic sectional view of a load lock chamber according to a second embodiment of the present invention.

FIG. 4A is a schematic sectional view of the load lock chamber 26 according to the second embodiment, in which the driving unit 21 moves the holding unit 18 in the upper direction to enclose the wafer surface. This embodiment is different from the first embodiment in that this embodiment moves the holding unit 18 to bring the shield and the wafer surface.

Figure 4B:
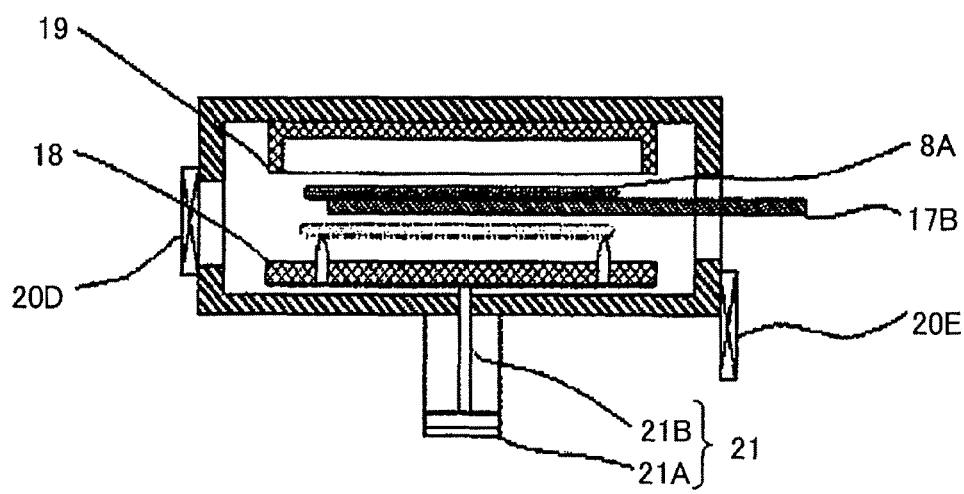

FIG. 4B is a schematic sectional view of the load lock chamber 26 in which the driving unit 21 moves the holding unit 18 in the lower direction, and enables the wafer 8A to be carried by the wafer carrier unit 17.

The driving unit 21 of the holding unit 18 may sit outside or inside the load lock chamber 26. This embodiment places the driving part 21A outside the load lock chamber 26, and introduces only the power transmission part 21B in the vacuum. The holding unit 18 has a wafer absorption part (not shown), and prevents a vibration of the wafer 8A when the holding unit 18 moves. In importing or exporting the wafer 8A, the wafer carrier unit 17 moves the holding unit 18 to a position that enables the wafer 8A to be transported. The holding unit 18 may move above, below, leftward, or rightward relative to the position of the wafer 8A.

An alternative embodiment moves only the support pin 18A up and down to move the wafer 8A to a position that enables the wafer carrier unit 17 to transport the wafer 8A in importing or exporting the wafer.

As the holding unit 18 moves, a space between the wafer surface and the shield 19 can have a distance of 0.5 cm or smaller. Therefore, the space near the wafer surface can have a temperature gradient of 10 [K/cm] or higher in comparison with the conventional vacuum chamber.

The load lock chamber 26 of this embodiment moves the holding unit 18, and reduces the particle that would fall on the wafer surface while the shield 19 moves. Moreover, the thermophoretic force affects particles floating near the wafer surface, and reduces the adhesions of the particles to the wafer surface.

Third Embodiment

Figure 5A:
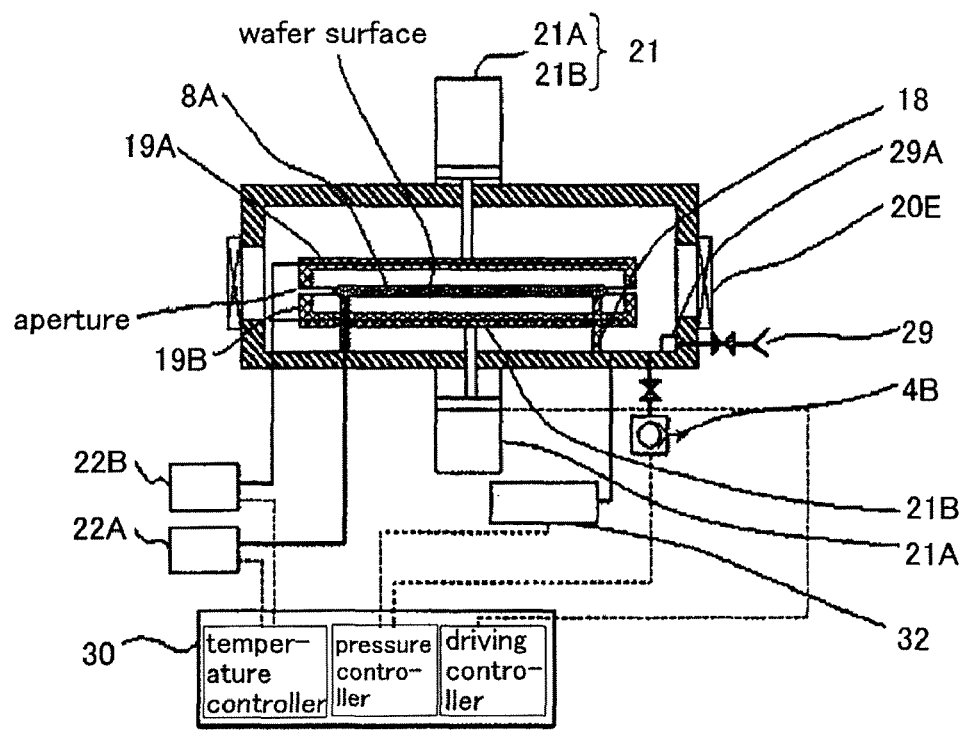
FIG. 5 is a schematic sectional view of a load lock chamber according to a third embodiment of the present invention.

FIG. 5A is a schematic sectional view of the load lock chamber 26 according to the third embodiment, in which a first shield 19A encloses the wafer's front surface, and a second shield 19B encloses the wafer's back surface. This embodiment is different from the first embodiment in that this embodiment provides the second shield 19B on a back surface side of the wafer.

The temperature of the holding unit 18 is controlled to the first temperature of 25° C. The first temperature is higher than the temperature (23° C.) of the wafer carried by the holding unit 18. The holding unit 18 of this embodiment contacts the back surface of the wafer 8A in an area within 5 mm from the outer periphery. The holding unit 18 has an absorption part (not shown). The holding unit 18 uniformly controls the temperature of the entire surface of the holding unit by circulating the heat medium around the outer periphery. Due to the heat conduction from the holding unit 18 to the wafer, the wafer temperature is controlled to about 25° C.

For the first shield 19A used to protect the wafer's front surface from the particles, the temperature of its surface opposite to the wafer's front surface is controlled to 15° C. For the second shield 19B used to protect the wafer's back surface from the particles, the temperature of its surface opposite to the wafer's back surface is controlled to 15° C.

Figure 5B:
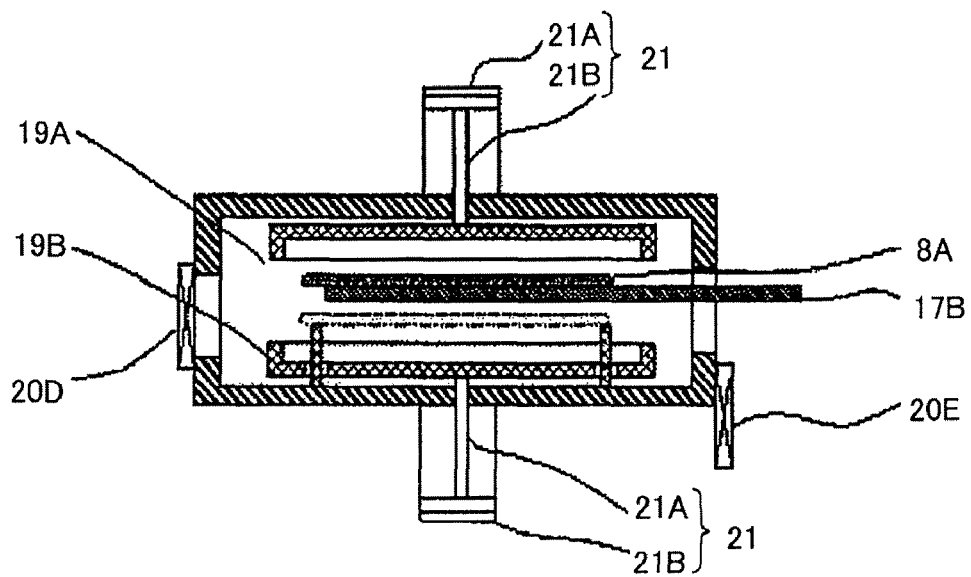

FIG. 5B is a schematic sectional view of the load lock chamber 26 in which the driving unit 21 moves the first shield 19A in the upper direction, and the driving unit 21 moves the second shield 19B in the lower direction so as to enable the wafer 8A to be transported. In exporting and importing the wafer 8A, the first and second shields retreat from the transport path before the wafer carrier unit 17B transports the wafer 8A. The shields 19A and 19B may move above, below, rightward, or leftward relative to the position of the wafer 8A.

By moving the first and second shields 19A and 19B, narrow spaces having distances of 0.5 cm or smaller can be formed between the shield and the wafer's front surface and between the shield and the wafer's back surface. Therefore, the space near the wafer surface can have a temperature gradient of 10 [K/cm] or higher in comparison with the conventional vacuum chamber.

According to the load lock chamber 26 of this embodiment, the first thermophoretic force affects the particles floating between the wafer's front surface and the first shield 19A. Moreover, the second thermophoretic force affects the particles floating between the wafer's back surface and the second shield 19B. Thereby, the particles floating between the wafer's front surface and the first shield 19A can be moved in a direction from the wafer's front surface to the first shield 19A. In addition, the particles floating between the wafer's back surface and the second shield 19B can be moved in a direction from the wafer's back surface to the second shield 19B.

An alternative embodiment fixes the shield, and uses the driving unit 21 to move the support pin 18A Up and down so that the first and second thermophoretic forces can affect the particles.

The load lock chamber of the third embodiment enables a larger force to affect the particles floating near the wafer's back surface than the thermophoretic force of the first and second embodiments, and can reduce the adhesions of the particles to the wafer's front and back surfaces.

Fourth Embodiment

Figure 6:
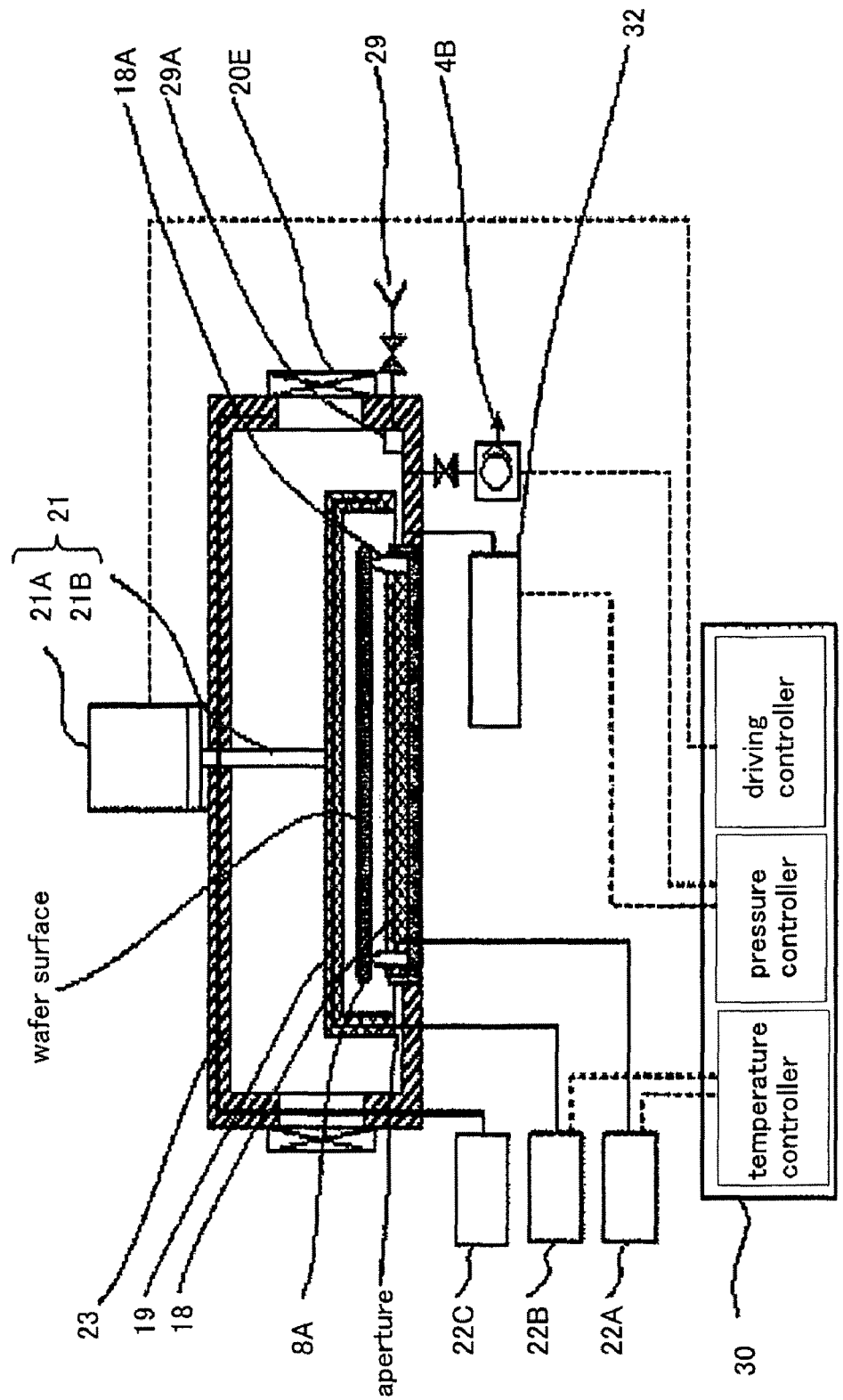
FIG. 6 is a schematic sectional view of a load lock chamber according to a fourth embodiment of the present invention.

FIG. 6 is a schematic sectional view of the load lock chamber 26 according to the fourth embodiment, in which the shield 19 encloses the periphery of the wafer 8A. This embodiment is different front the first embodiment in that an internal member 23 has a third temperature controlling unit 22C in the load lock chamber.

This embodiment makes the internal member 23 of the internal wall of the load lock chamber, and the temperature of the internal wall is controlled to the third temperature (23° C.) as a reference temperature. The space between the shield and the internal wall of the load lock chamber has a temperature gradient, and the thermophoretic force affects the particles floating in this space. As the temperature of the shield 19 becomes lower than 23° C., the thermophoretic force in this space can be made stronger.

According to the load lock chamber 26 of this embodiment, the thermophoretic force affects the particles floating between the wafer surface and the shield 19. Moreover, a second thermophoretic force affects the particles floating between the shield 19 and the internal wall of the load lock chamber, reducing the adhesions of the particles to the wafer surface.

The shield 19 may move be above, below, leftward, or rightward relative to the position of the wafer 8A. The holding unit 18 may move above, below, leftward, or rightward relative to the position of the wafer 8A. Before the wafer carrier unit 17 transports the wafer 8A, they retreat from the transport path.

While the above embodiments are applied to a semiconductor wafer as a silicon substrate, the substrate to which the present invention is applied is not limited to the wafer. In addition, the vacuum chamber can reduce the adhesions of the particles to the substrate surface because the thermophoretic force affects the particles floating near the substrate surface. While this embodiment arranges the substrate surface perpendicular to the gravity direction, the present invention does not limit an orientation of the substrate.

Further, the present invention is not limited to these preferred embodiments and various variations and modifications may be made without departing from the scope of the present invention.

This application claims foreign priority benefits based on Japanese Patent Application No. 2007-100322, filed on Apr. 6, 2007, which is hereby incorporated by reference herein in its entirety as if fully set forth herein.

What is claimed is:

1. A processing apparatus configured to process a substrate under a vacuum environment, the processing apparatus comprising:
   a processing chamber for processing the substrate;
   a load lock chamber connected to the processing chamber via a gate valve;

a holding unit arranged in the load lock chamber and configured to hold a back surface side of the substrate;
a dust collection part having a surface opposite to a front surface of the substrate held by the holding unit;
a temperature controlling unit configured to control a temperature of the surface of the dust collection part opposite to the front surface of the substrate to a temperature lower than a temperature of the substrate;
a driving unit configured to bring one of the holding unit and the dust collection part close to the other of the holding unit and the dust collection part; and
a driving controller configured to control the driving unit moving at least one of the holding unit and the dust collection part, where the temperature has been controlled, closer to the other so that a distance between the front surface of the substrate and the surface of the dust collection part after importing the substrate into the load lock chamber becomes smaller than the distance during the importation.

2. The processing apparatus according to claim 1, wherein the temperature controlling unit and the driving controller are configured to control the driving unit and the temperature controlling unit so that a temperature gradient of a space between the substrate held by the holding unit and the dust collection part can be 10 K/cm or higher.

3. The processing apparatus according to claim 1, wherein the dust collection part is a dust collection unit that is provided in the load lock chamber, and the temperature controlling unit controls a temperature of a surface of the load lock chamber opposite to the dust collection unit to a temperature lower than a temperature of the dust collection unit opposite to the vacuum chamber.

4. The processing apparatus according to claim 1, wherein the processing apparatus is an exposure apparatus configured to expose a pattern of an original to the substrate.

5. A processing apparatus configured to process a substrate under a vacuum environment, the processing apparatus comprising:
a holding unit configured to hold the substrate;
a dust collection part having a surface opposite to the substrate held by the holding unit;
a temperature controlling unit configured to control a temperature of the surface of the dust collection part opposite to the substrate to a temperature lower than a temperature of the substrate;
a driving unit configured to bring one of the holding unit and the dust collection part close to the other of the holding unit and the dust collection part; and
a driving controller configured to control the driving unit moving at least one of the holding unit and the dust collection part, where the temperature has been controlled, closer to the other so that a distance between the front surface of the substrate and the surface of the dust collection part after importing the substrate into a load lock chamber becomes smaller than the distance during the importation.

* * * * *